United States Patent
Sederberg et al.

(10) Patent No.: US 10,249,086 B2
(45) Date of Patent: Apr. 2, 2019

(54) PHYSICAL OBJECT PRODUCTION USING A REFINED MODEL

(71) Applicant: Brigham Young University (BYU), Provo, UT (US)

(72) Inventors: Thomas W. Sederberg, Orem, UT (US); Xin Li, Hefei (CN)

(73) Assignee: Brigham Young University, Provo, UT (US)

( * ) Notice: Subject to any disclaimer, the term of this patent is extended or adjusted under 35 U.S.C. 154(b) by 0 days.

(21) Appl. No.: 15/944,333

(22) Filed: Apr. 3, 2018

(65) Prior Publication Data

US 2018/0293791 A1 Oct. 11, 2018

Related U.S. Application Data

(60) Provisional application No. 62/481,817, filed on Apr. 5, 2017.

(51) Int. Cl.
*G06T 17/20* (2006.01)
*G06T 17/30* (2006.01)
*G06F 17/50* (2006.01)

(52) U.S. Cl.
CPC .......... *G06T 17/20* (2013.01); *G06F 17/5004* (2013.01); *G06F 17/5086* (2013.01); *G06T 17/205* (2013.01); *G06T 17/30* (2013.01)

(58) Field of Classification Search
None
See application file for complete search history.

(56) References Cited

U.S. PATENT DOCUMENTS 8,914,259 B2 * 12/2014 Kripac .................... G06T 17/30
345/420

OTHER PUBLICATIONS

Cashman, T., NURBS—compatible subdivision surfaces, Mar. 2010, University of Cambridge, Technical dissertation, pp. 1-99.*
Li, X., Finnigan, G., Sederberg, T., G1 Non-Uniform Catmull-Clark Surfaces, Jul. 2016, ACM Transactions on Graphics 2016, SIGGRAPH 2016, vol. 35, Issue 4, pp. 1-8.*
T. J. Cashman et al.: "NURBS wit Extraordinary Points: High-degree, Non-uniform, Rational Subdivision Schemes," ACM Transactions on Graphics, vol. 28, No. 3, Article 46, Aug. 2009, 10 pages.

(Continued)

*Primary Examiner* — Said Broome
(74) *Attorney, Agent, or Firm* — Brake Hughes Bellermann LLP

(57) ABSTRACT

Techniques of refining a model of a complex surface can include deriving a set of refinement rules based on eigen polyhedra in a plane. Such rules reduce the refinement of a mesh in the plane to a scale and translation of the eigen polyhedron. Such refinement rules may then be applied to a non-uniform mesh in three-dimensional space having an extraordinary point in place of conventional refinement rules used in Catmull-Clark surfaces or NURBS surfaces. When these refinement rules are applied to a non-uniform mesh having an extraordinary point, the limiting surface is $G^1$ at the extraordinary point, i.e., the tangent surfaces of the limiting mesh are continuous at the extraordinary point.

20 Claims, 14 Drawing Sheets

(56) References Cited

OTHER PUBLICATIONS

T. J. Casman: "NURBS—compatible subdivision surfaces," Technical Report, No. 773, University of Cambridge Computer Laboratory, Mar. 2010, 99 pages.
D. Kovacs et al.: "Dyadic T-mesh Subdivision," ACM Transactions on Graphics, vol. 34, No. 4, Article 143, Aug. 2015, 12 pages.
X. Li et al.: "G1 Non-Uniform Catmull-Clark Surfaces," ACM Transactions on Graphics, vol. 35, No. 4, Article 135, Jul. 2016, 8 pages.
K. Müller et al.: "Extended Subdivision Surfaces: Building a ridge Between NURBS and Catmull-Clark Surfaces," ACM Transactions on Graphics, vol. 25, No. 2, Apr. 2006, pp. 268-292.
K. Müller et al.: "DINUS: Double Insertion, Nonuniform, Stationary Subdivision Surfaces," ACM Transactions on Graphics, vol. 29, No. 3, Article 25, Jun. 2010, 21 pages.
T. Sederberg et al.: "Non-Uniform Recursive Subdivision Surfaces," SIGGRAPH '98 Proceedings of the 25th annual conference on Computer graphics and interactive techniques, Jul. 24, 1998, pp. 387-394.
T. Sederberg et al.: "T-splines and T-NURCCs" ACM Transactions on Graphics—Proceedings of ACM SIGRAPH 2003, vol. 22, Issue 3, Jul. 2003, pp. 477-484.

\* cited by examiner

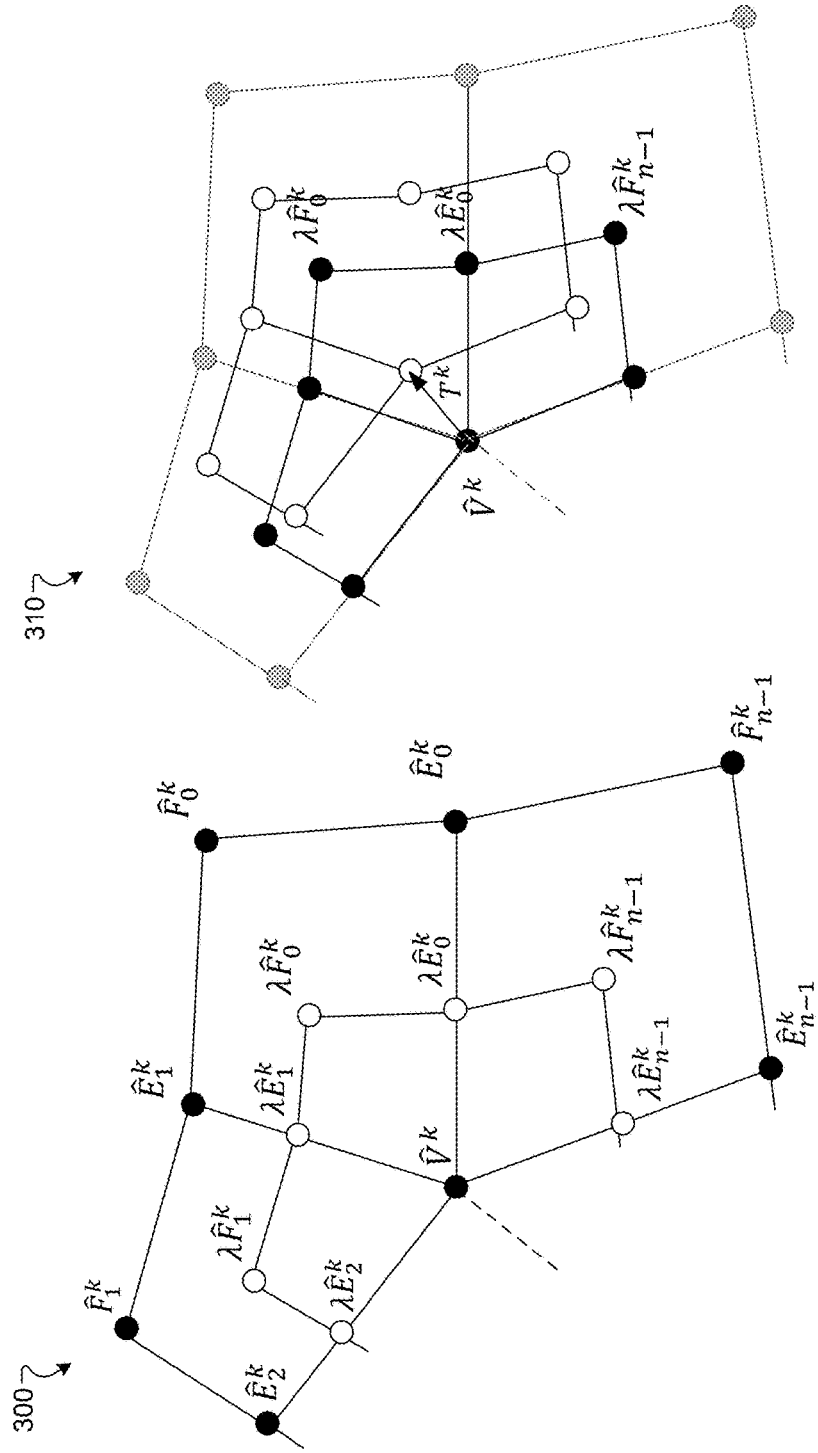

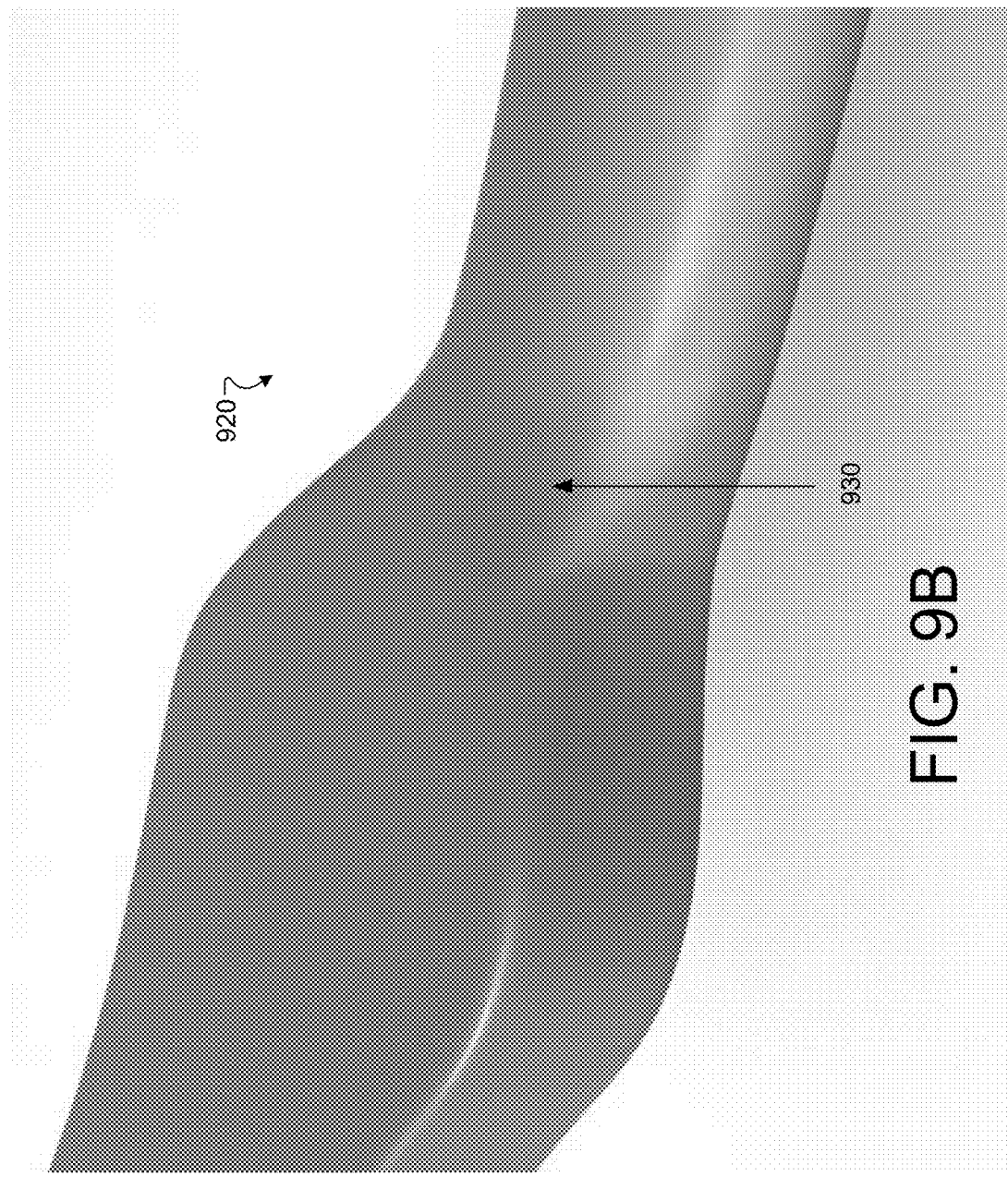

PHYSICAL OBJECT PRODUCTION USING A REFINED MODEL

CROSS-REFERENCE TO RELATED APPLICATIONS

This application is a nonprovisional of, and claims priority to, U.S. Provisional Patent Application No. 62/481,817, filed on Apr. 5, 2017, entitled "PHYSICAL OBJECT PRODUCTION USING A REFINED MODEL," the disclosure of which are incorporated by reference herein in their entireties.

TECHNICAL FIELD

This description relates to generation of surface models of physical objects for manufacture.

BACKGROUND

Some precision manufacturing technologies use mathematical models of complex surfaces to represent manufacturable objects. Such models include Catmull-Clark surfaces and non-uniform rational B-spline (NURBS) surfaces. Such a model takes the form of a polyhedral mesh that is a level of approximation to a continuous representation of a manufacturable object. The model may be refined from a relatively coarse mesh to a finer mesh in a recursive fashion until a level of smoothness has been achieved. Conventional approaches to refining a model of a complex surface include defining refinement rules for the control points of a patch region of a mesh: a vertex, edge points that lie on edges of the mesh connecting control points, and face points that lie in the center of faces of the mesh.

SUMMARY

In one general aspect, a method can include receiving, by processing circuitry configured to generate a surface model representing an object for manufacture, spatial mesh data representing a spatial mesh, the spatial mesh including a vertex of the spatial mesh and a plurality of edges, the vertex being an extraordinary control point of the spatial mesh, each of the plurality of edges being disposed between the vertex and a respective, adjacent control point of the spatial mesh, the vertex having a valence number with respect to the plurality of edges. The method can also include generating, by the processing circuitry, eigen polyhedron data representing a plane mesh including an initial vertex in a plane and a plurality of initial edge points in the plane, the plurality of initial edge points being arranged in the plane with respect to the initial vertex based on the valence number. The method can further include generating, by the processing circuitry, scale data representing a scale factor based on the valence, the plane mesh being configured to scale in size with respect to the initial vertex in the plane by the scale factor after a plane mesh refinement operation. The method can also include generating, by the processing circuitry, refinement matrix data representing a refinement matrix based on the eigen polyhedron data, the eigen polyhedron data being eigenvectors of the refinement matrix data, the scale factor being an eigenvalue of the refinement matrix corresponding to at least one of the eigenvectors. The method can also include performing, by the processing circuitry, a spatial mesh refinement operation on the mesh data to produce refined mesh data, the spatial mesh refinement operation being based on the refinement matrix data, the refined mesh data representing a refined mesh and providing a surface model that has continuous tangent planes in the neighborhood of a vertex of the refined spatial mesh.

The details of one or more implementations are set forth in the accompanying drawings and the description below. Other features will be apparent from the description and drawings, and from the claims.

BRIEF DESCRIPTION OF THE DRAWINGS

FIG. 3A is a diagram illustrating an example scaling of an eigen polyhedron as part of a plane mesh refinement operation to produce a scaled eigen polyhedron.

FIG. 3B is a diagram illustrating an example translation of the scaled eigen polyhedron as part of the plane mesh refinement operation to produce a refined plane mesh.

FIG. 9B is a diagram illustrating the example manufacturable object that is $G^1$ at the extraordinary control point.

DETAILED DESCRIPTION

The above-described conventional approaches to refining a model of a complex surface may result in surface models with undesirable features. For example, refinement rules used in refining non-uniform Catmull-Clark and NURBS surfaces may result in surface tangent discontinuities at extraordinary vertices of the mesh (i.e., vertices having a valence number not equal to four, or having less than or greater than four adjacent edge points). Such surface tangent discontinuities introduce artifacts such as cusps into a surface model that distort the object represented by the surface model.

In accordance with the implementations described herein and in contrast to at least some of the conventional approaches to refining a model of a complex surface, improved techniques of refining a model of a complex surface can include deriving a set of refinement rules based on eigen polyhedra in a plane. Such rules reduce the refinement of a mesh in the plane to a scale and translation of the eigen polyhedron. Such refinement rules may then be applied to a non-uniform mesh in three-dimensional space having an extraordinary point in place of conventional refinement rules used in Catmull-Clark surfaces or NURBS surfaces. When these refinement rules are applied to a non-uniform mesh having an extraordinary point, the limiting surface is $G^1$ at the extraordinary point, i.e., the tangent surfaces of the limiting mesh are continuous at the extraordinary point.

Figure 1:
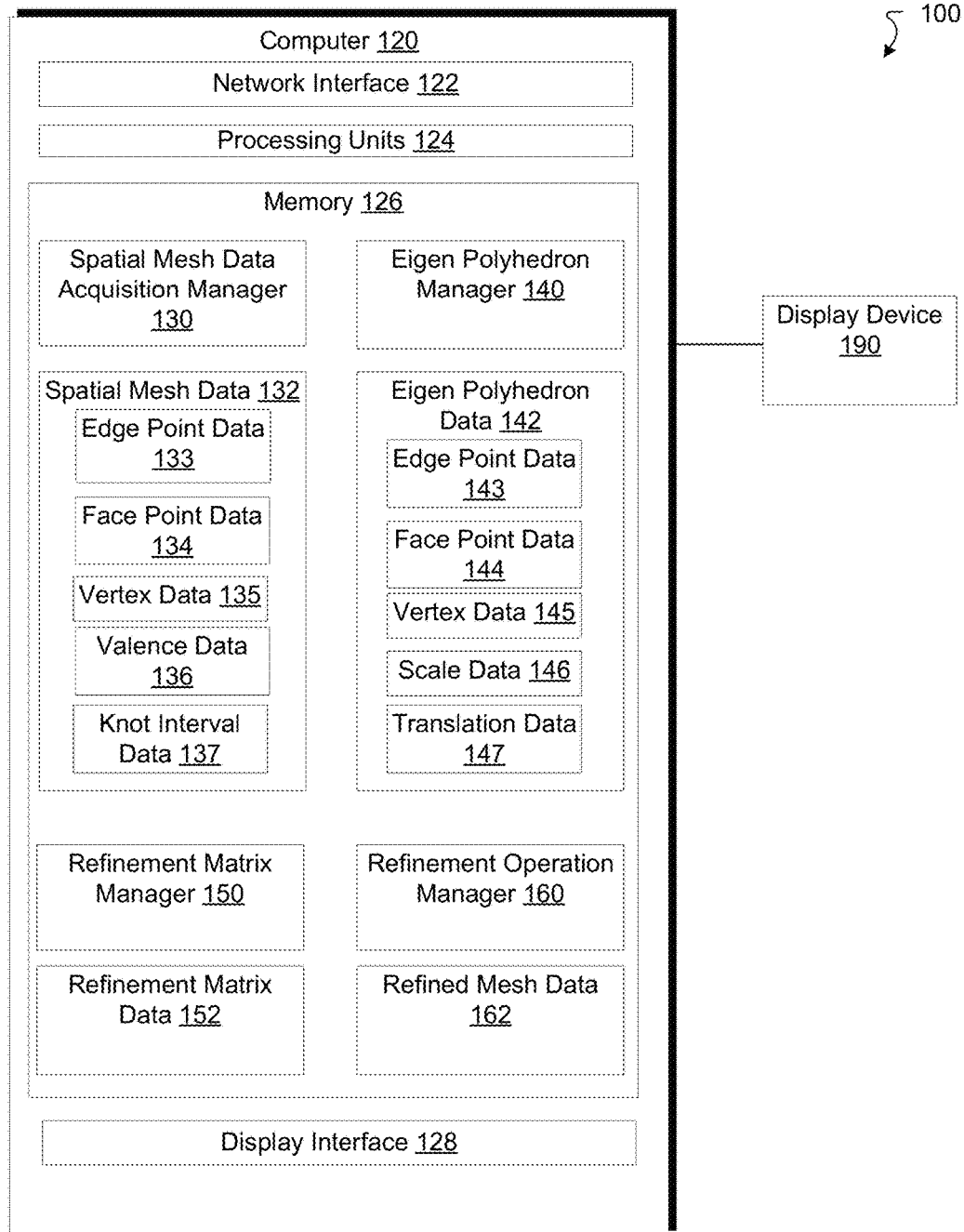
FIG. 1 is a diagram that illustrates an example electronic environment in which improved techniques described herein may be implemented.

FIG. 1 is a diagram that illustrates an example electronic environment 100 (e.g., device or set of devices) in which the above-described improved techniques may be implemented. As shown, in FIG. 1, the electronic environment 100 includes a computer 120 and a display 190.

The computer 120 is configured to generate a surface model representing an object for manufacture. The computer 120 includes a network interface 122, one or more processing units 124, memory 126, and a display interface 128. The set of processing units 124 and the memory 126 together form control circuitry, which is configured and arranged to perform various methods and functions as described herein.

In some embodiments, one or more of the components of the computer 120 can be, or can include processors (e.g., processing units 124) configured to process instructions stored in the memory 126. Examples of such instructions as depicted in FIG. 1 include a spatial mesh data acquisition manager 130, an eigen polyhedron manager 140, refinement matrix manager 150, and a refinement operation manager 160. Further, as illustrated in FIG. 1, the memory 126 is configured to store various data, which is described with respect to the respective managers that use such data.

The spatial mesh data acquisition manager 130 is configured to receive spatial mesh data 132 from any source of such data. In some implementations, the spatial mesh data acquisition manager 130 may be implemented as part of a software package used generally to model surfaces of manufacturable objects, such as a computer-aided design (CAD) program. In some implementations, the spatial mesh data acquisition manager 130 is configured to acquire the spatial mesh data 132 over the network interface 122 from an external application.

The spatial mesh data 132 includes three-dimensional point, edge, and face data that defines a spatial mesh. For the discussion to follow, it is assumed that the spatial mesh data 132 has been refined so that the discussion is focused on the point data. Such point data includes edge point data 133, face point data 134, and vertex data 135. For example, when the refined spatial mesh defined by the spatial mesh data 132 includes an extraordinary control point, then the vertex data 135 represents, as the extraordinary control point, a vertex of the spatial mesh. Moreover, the edge point data 133 represents edge points adjacent to the vertex that lie on edges between adjacent control points of the spatial mesh that are not extraordinary control points. The face point data 134 represents face points adjacent to the vertex that lie on faces defined by the edges on which the edge points lie.

The spatial mesh data 132 also includes valence data 136 representing a valence number of the vertex. In the following discussion and hereinafter, it is assumed that each face of the spatial mesh representing the object has four edges. In this case, the vertex, being an extraordinary point, has a valence number not equal to four (e.g., equal to three, five, six, and so on). In some implementations, each face of a spatial mesh represented by the spatial mesh data 132 has some number other than four edges. In that case, then an extraordinary point would have a valence not equal to that number.

The spatial mesh data 132 further includes knot interval data 137 representing knot intervals between the points of the spatial mesh. A knot interval is equal to the difference between two adjacent knots in a knot sequence of a B-spline surface. Accordingly, a knot interval is distance between points in a mesh.

Figure 2A:
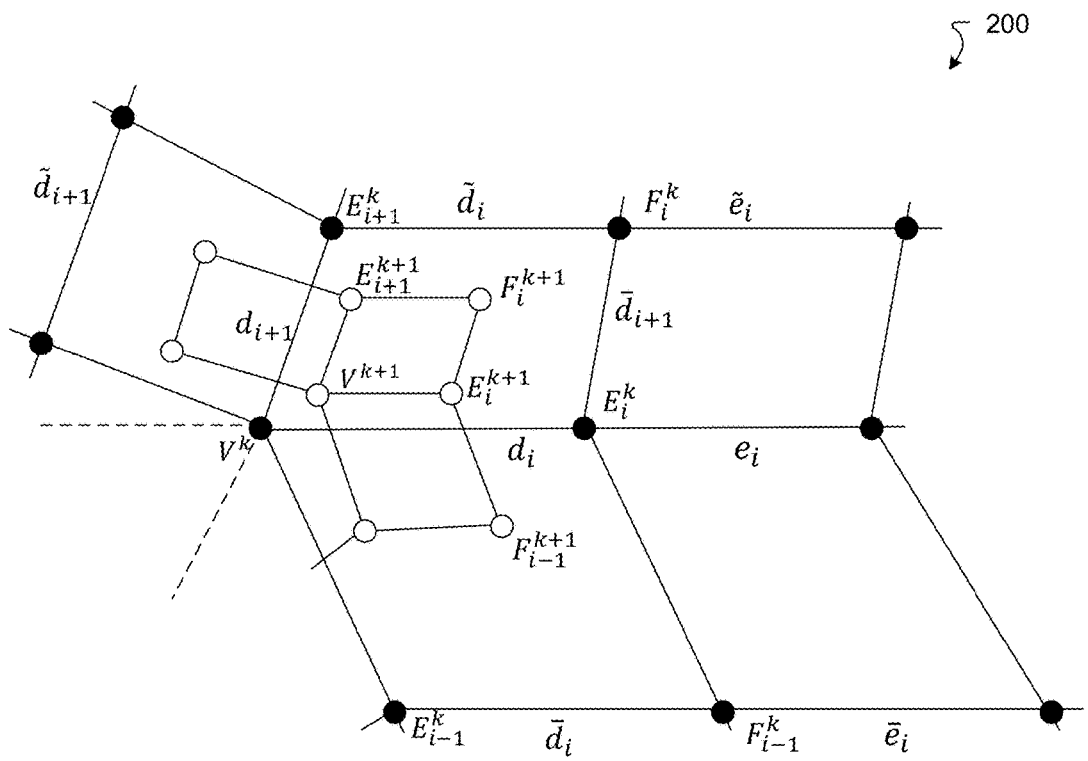
FIG. 2A is a diagram illustrating an example nonuniform spatial mesh having an extraordinary point.

FIG. 2A is a diagram illustrating an example spatial mesh 200 having a valence n vertex undergoing a refinement operation. The filled circles represent points in three-dimensional space of a spatial mesh 200 at refinement iteration k, while the open circles represent points in three-dimensional space of the spatial mesh 200 at refinement iteration k+1. As shown in FIG. 2A, the vertex at iteration k is denoted $V^k$ and at iteration k+1 is denoted $V^{k+1}$. The n adjacent edge points at refinement iteration k are denoted $E_i^k$ and the n adjacent face points at refinement iteration k are denoted $F_i^k$, with the subscript i=0, 1, . . . , n−1. The subscripts are modulo n.

The knot intervals between the various points of the spatial mesh 200 are denoted in FIG. 2A as follows: $d_i=|V^k E_i^k|$, $\tilde{d}_i=|F_i^k E_{i+1}^k|$, $\bar{d}_i=|F_{i-1}^k E_{i-1}^k|$. Similar knot intervals (e.g., $e_i$, $\tilde{e}_i$, $\bar{e}_i$) between other points in the spatial mesh 200 are similarly denoted. In a general, non-uniform mesh, these knot intervals may be different. In some meshes such as a Catmull-Clark mesh, the knot intervals may all be equal. For the purposes of the discussion to follow, it is assumed that $d_i=\bar{d}_i=\tilde{d}_i$ and $e_i=\tilde{e}_i=\bar{e}_i$ (i.e., the knot intervals on opposing edges of every face are equal).

The spatial mesh 200 may be represented by a (2n+1)×3 spatial mesh matrix $P^k=[F_0^k, \ldots, F_{n-1}^k, E_0^k, \ldots, E_{n-1}^k, V^k]^T$. Because a refinement operation is linear in the coordinates of the points of the spatial mesh 200, such a refinement operation may be expressed mathematically as a matrix operation as follows:

$$P^{k+1}=M^k P^k, \qquad (1)$$

where $M^k$ is a (2n+1)×(2n+1) refinement matrix defining a refinement operation for the $k^{th}$ refinement iteration. In some arrangements—and for the purposes of the discussion to follow—the refinement matrix is independent of k and the refinement operation may be written as $$P^{k+1}=MP^k, \qquad (2)$$

where M is the (2n+1)×(2n+1) stationary refinement matrix, which will herein be referred to as the refinement matrix. Details of conventional refinement matrices are discussed in some detail with respect to FIGS. 2B and 2C.

Figure 2B:
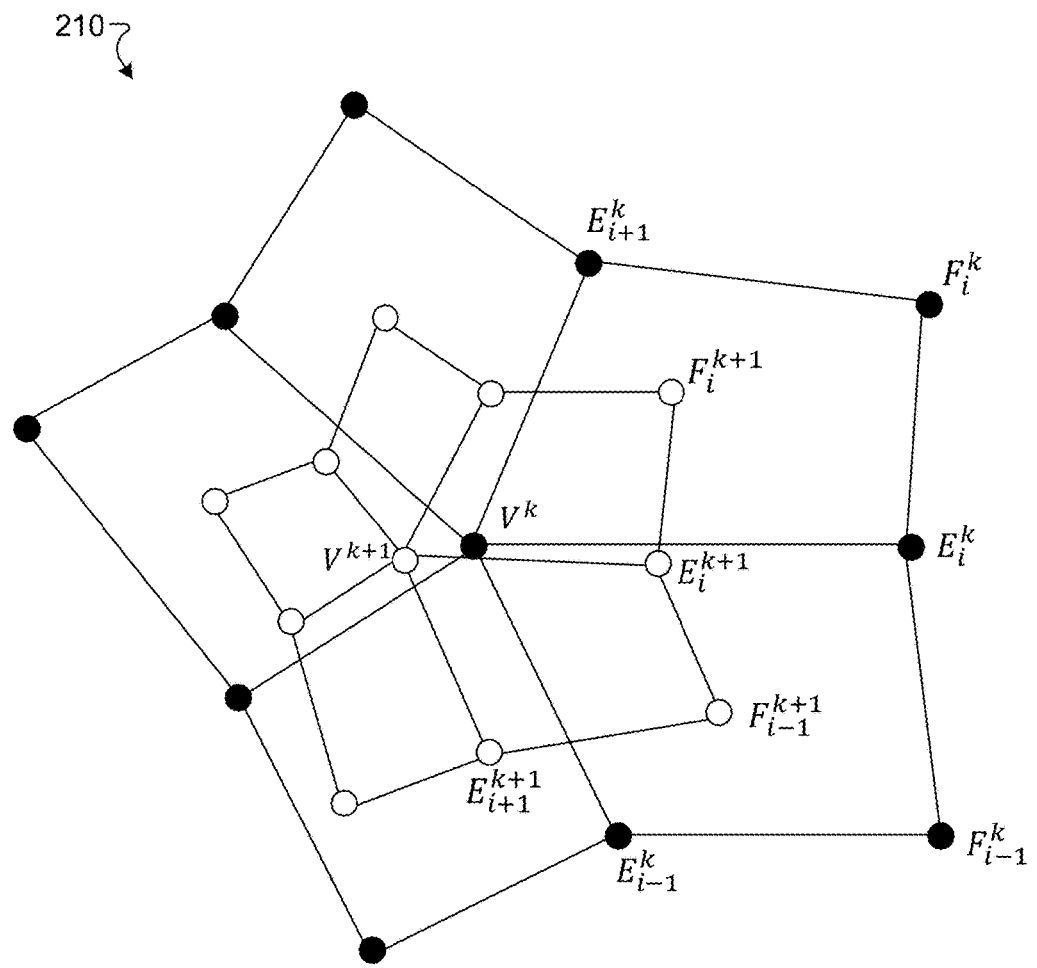
FIG. 2B is a diagram illustrating an example spatial mesh for a Catmull-Clark B-spline surface having an extraordinary point.

FIG. 2B is a diagram illustrating refinement of an example spatial mesh 210 for a Catmull-Clark B-spline surface having an extraordinary point. For the spatial mesh 210, the vertex $V^k$ is an extraordinary point with a valence number equal to five. Further, all knot intervals all equal. In some implementations, conventional refinement rules for a Catmull-Clark B-spline surface with a vertex having a valence number equal to n are as follows:

$$4F_i^{k+1} = V^k + E_i^k + E_{i+1}^k + F_i^k, \quad (3)$$

$$4E_i^{k+1} = V^k + F_{i-1}^{k+1} + F_i^{k+1} + E_i^k, \quad (4)$$

$$n^2 V^{k+1} = n(n-3)V^k + \sum_{i=0}^{n-1}(V^k + E_i^k + F_i^{k+1}). \quad (5)$$

By substituting Eqs. (3) and (4) into Eq. (5), one may construct the refinement matrix M.

Figure 2C:
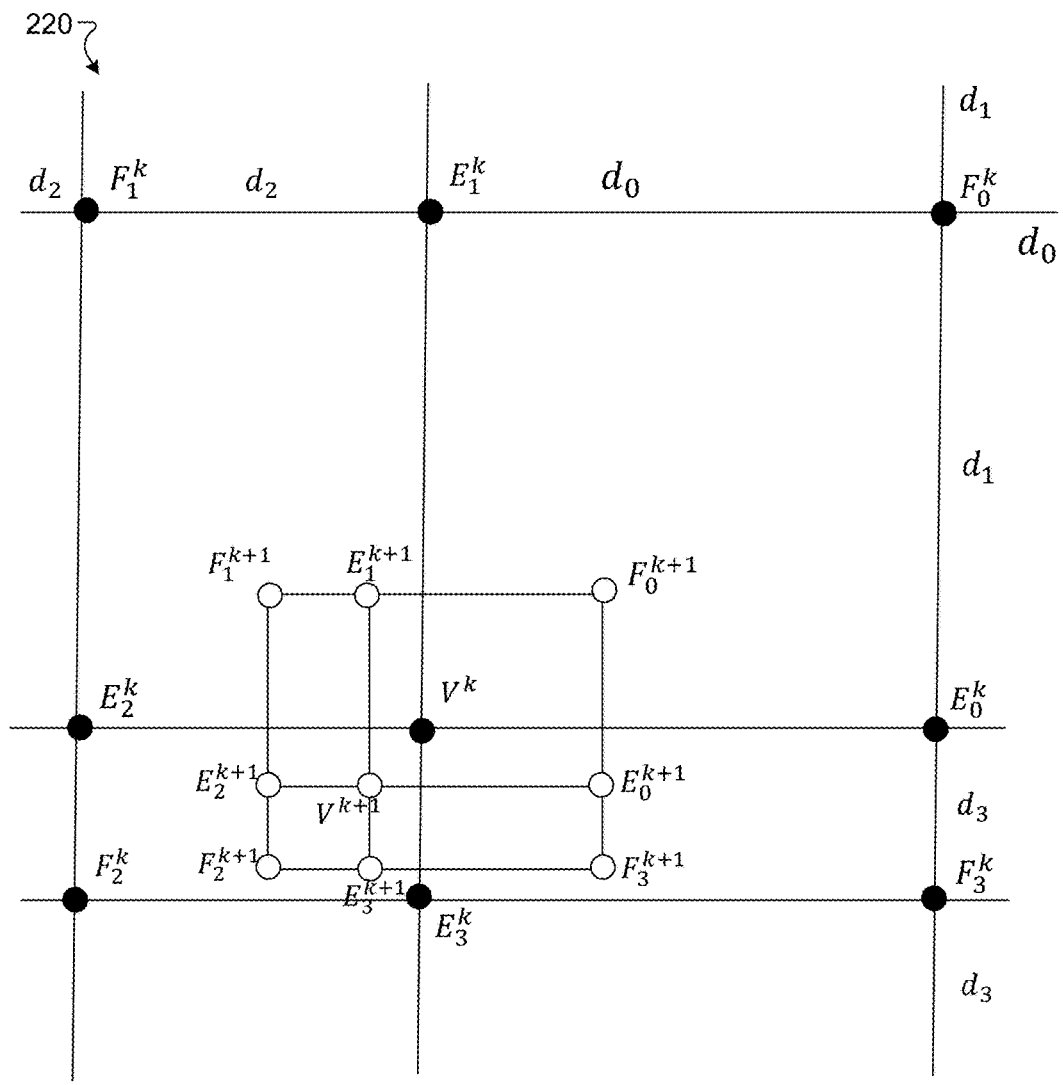
FIG. 2C is a diagram illustrating an example spatial mesh for a non-uniform rational B-spline (NURBS) surface.

FIG. 2C is a diagram illustrating a conventional refinement of an example spatial mesh 220 for a non-uniform rational B-spline (NURBS) surface. Assuming that $d_i = e_i$, etc., for i=0, 1, 2, 3, in some implementations, conventional refinement rules for the NURBS surface shown in FIG. 2C are as follows:

$$4(2d_i + d_{i+2})(d_{i-1} + 2d_{i+1})F_i^{k+1} = \quad (6)$$
$$9 d_i d_{i+1} V^k + (d_{i+1} + 2d_{i-1})(d_i + 2d_{i+2})F_i^k +$$
$$3 d_{i+1}(d_i + 2d_{i+2})E_i^k + 3 d_i(d_{i+1} + 2d_{i-1})E_{i+1}^k,$$

$$2(d_{i+1} + d_{i-1})E_i^{k+1} = d_{i-1}F_i^{k+1} + d_{i+1}F_{i-1}^{k+1} + (d_{i+1} + d_{i-1})H_i^k, \quad (7)$$

$$4(d_0 + d_2)(d_1 + d_3)V^{k+1} = (d_0 + d_2)(d_1 + d_3)V^k + \sum_{i=0}^{3}(h_i H_i^k + f_i F_i^{k+1}), \quad (8)$$

where $f_i = d_{i-1} d_{i+2}$, $h_i = d_{i+2}(d_{i+1} + d_{i-1})$, and $$H_i^k = \frac{3 d_i V^k + (d_i + 2d_{i+2})E_i^k}{2(2d_i + d_{i+2})}. \quad (9)$$

The conventional refinement rules summarized above for the spatial meshes 210 and 220 for Catmull-Clark B-spline surfaces in Eqs. (3)-(5) and for NURBS surfaces in Eqs. (6)-(9) may lead to discontinuities in the tangent at the vertex of each spatial mesh 210 and 220. The discussion that follows is directed to the generation of refinement rules for Catmull-Clark B-spline surfaces and NURBS surfaces having vertices that are extraordinary points. The generation of such refinement rules involves defining eigen polyhedra that have simple refinement behaviors which can be employed in refining the spatial meshes shown in FIGS. 2A-2C.

Returning to FIG. 1, the eigen polyhedron manager 140 is configured to generate eigen polyhedron data 142 representing a plane mesh. As is demonstrated with respect to FIGS. 3A, 3B, 4, 5A, 5B, 6, and 7A-C, the eigen polyhedron manager 140 generates the eigen polyhedron data 142 based on the valence data 136 and the knot interval data 137.

The eigen polyhedron data 142 includes two-dimensional point data that defines an eigen polyhedron, i.e., a plane mesh. The two-dimensional point data includes initial edge point data 143, initial face point data 144, and initial vertex data 145. The initial vertex data 145 represents an initial vertex in a plane that serves as an origin. The initial edge point data 143 represents edge points in the plane adjacent to the vertex. The initial face point data 144 represents face points adjacent to the vertex and the initial edge points. The initial edge point data 143, initial face point data 144, and initial vertex data 145 form new edge points, face points, and vertices upon a refinement operation.

The refinement operation for the plane mesh takes the simple form of a scale and a translation. Accordingly, the eigen polyhedron data 142 also includes scale data 146 representing the scale and translation data 147 representing the translation. Denote the $k^{th}$ iteration of the eigen polyhedron as a (2n+1)×2 matrix $\hat{P}^k = [\hat{F}_0^k, \ldots, \hat{F}_{n-1}^k, \hat{E}_0^k, \ldots, \hat{E}_{n-1}^k, \hat{V}^k]^T$, where $\hat{F}_i^k$ is a face point in the plane, $\hat{E}_i^k$ is an edge point in the plane, and $\hat{V}^k$ is the vertex in the plane, with the subscript i=0, 1, n−1, and $\hat{V}^0 = (0,0)$ is taken to be the origin of the plane. The subscripts are modulo n.

The eigen polyhedron $\hat{P}^0$ is defined with respect to a refinement matrix M as follows:

$$\hat{P}^1 = M\hat{P}^0 = \lambda \hat{P}^0 + T^0 I, \quad (10)$$

where $\lambda$ is the scale factor, $T^0 \in \mathbb{R}^2$ is a translation vector, and I is a (2n+1)×1 vector of ones. Because $\hat{V}^0 = (0,0)$, the translation vector is $T^0 = \hat{V}^1$. By repeating this refinement operation k times and using the fact that each of the rows of M sum to one and, consequently, $M(T^0 I) = T^0 I$, the $k^{th}$ iteration of the eigen polyhedron is $$\hat{P}^k = \lambda^k \hat{P}^0 - \hat{V}^k I \quad (11)$$

where $\hat{V}^k = (1 + \lambda + \lambda^2 + \ldots + \lambda^{k-1})\hat{V}^1$. The transformation in Eq. (11) may be rewritten into the form $$\hat{P}^{k+1} = M\hat{P}^k = [\kappa(\hat{P}^k - \hat{V}^k I) + \hat{V}^k I] + T^k I, \quad (12)$$

where $T^k = \hat{V}^{k+1} - \hat{V}^k$. The relationship described in Eq. (12) is described with respect to FIGS. 3A and 3B.

FIG. 3A is a diagram illustrating an example scaling of an eigen polyhedron 300 as part of refinement operation described in Eq. (12) to produce a scaled eigen polyhedron. As shown in FIG. 3A, the $k^{th}$ iteration of the points of the eigen polyhedron has filled circles and the next iteration of the points of the eigen polyhedron has open circles. The scaling is performed with respect to the vertex $\hat{V}^k$. That is, each iteration of the eigen polyhedron is initially shifted to the origin, scaled, and then shifted back to $\hat{V}^k$. The result is that the eigen polyhedron preserves its shape upon the refinement.

FIG. 3B is a diagram illustrating an example translation of an eigen polyhedron 310 as part of refinement operation described in Eq. (12) to produce a refined eigen polyhedron. The translation is, as described above, given by $T^k = \hat{V}^{k+1} - \hat{V}^k$. As shown in FIG. 3B, the $k^{th}$ iteration of the points of the eigen polyhedron has grayed-out circles, the points of the scaled plane mesh have filled circles, and the points of the translated plane mesh, i.e., the refined eigen polyhedron, has open circles.

Eq. (10) may be rewritten in the following form:

$$M\left(\hat{P}^0 - \frac{\hat{V}^1}{1-\lambda}I\right) = \lambda\left(\hat{P}^0 - \frac{\hat{V}^1}{1-\lambda}I\right). \quad (13)$$

That is, the quantity in the parenthesis is a pair of eigenvectors of the refinement matrix M and the scale factor $\lambda$ is an eigenvalue of M to which at least one eigenvector corresponds. In conventional situations, one would know the refinement matrix M and would then use standard techniques to determine its eigenvalues and corresponding eigenvectors.

In this situation, the refinement matrix M is to be determined from the eigen polyhedron $\hat{P}^0$ and the scale factor $\lambda$. This is an inverse eigenvalue problem in which a matrix is to be determined from its eigenvalues and corresponding eigenvectors. In the discussion to follow, a single expression for the initial eigen polyhedron $\hat{P}^0$, scale factor $\lambda$, and translation $\hat{V}^1$ will be produced for each of the Catmull-Clark B-spline and NURBS surfaces. From this single expression, many refinement matrices may be deduced that have this same eigenvalue and eigenvector. Additional properties of the refinement matrix M thus may be provided to produce new refinement rules in each case. By specifying refinement rules based on nondeforming transformations of the eigen polyhedron, it is expected that the limiting polyhedron to which the refinement rules are applied will have desired smoothness properties in the neighborhood of an extraordinary point.

Figure 4B:
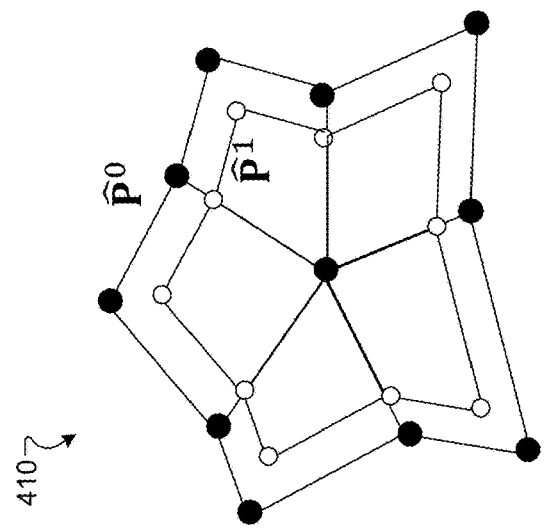
FIG. 4B is a diagram illustrating an example eigen polyhedron used to determine refinement rules for a Catmull-Clark B-spline surface having an extraordinary point with a valence number equal to 5.
Figure 4A:
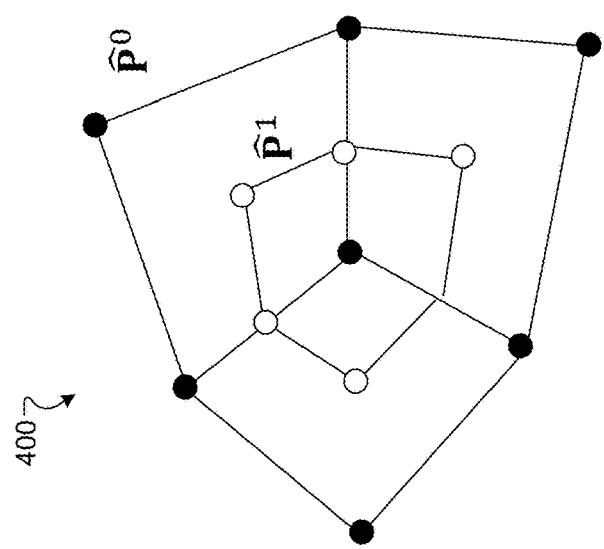
FIG. 4A is a diagram illustrating an example eigen polyhedron used to determine refinement rules for a Catmull-Clark B-spline surface having an extraordinary point with a valence number equal to 3.

The eigen polyhedron is defined here explicitly for a Catmull-Clark B-spline surface and a NURBS surface. In one example, FIG. 4A is a diagram illustrating an example eigen polyhedron 400 used to determine refinement rules for a Catmull-Clark B-spline surface having an extraordinary point with a valence number equal to 3. In another example, FIG. 4B is a diagram illustrating an example eigen polyhedron 410 used to determine refinement rules for a Catmull-Clark B-spline surface having an extraordinary point with a valence number equal to 5. The knot intervals of a Catmull-Clark B-spline surface are equal and, as shown in FIGS. 4A and 4B, the spoke lengths between the initial vertices and the respective initial edge points of the plane meshes are equal.

In some implementations, a Catmull-Clark eigen polyhedron based on a Catmull-Clark B-spline surface having an extraordinary point with a valence number equal to n is defined as follows:

$$\hat{V}^0 = (0, 0), \quad (14)$$

$$\hat{E}_i^0 = \left(\cos\left(\frac{2\pi i}{n}\right), \sin\left(\frac{2\pi i}{n}\right)\right), \quad (15)$$

$$\hat{F}_i^0 = \gamma(\hat{E}_i^0 + \hat{E}_{i+1}^0), \text{ where} \quad (16)$$

$$\gamma = \frac{4}{c_n + 1 + \sqrt{(c_n + 1)(c_n + 9)}}, \quad (17)$$

where $$c_n = \cos\left(\frac{2\pi}{n}\right).$$

In this case, $T^0=(0,0)$ and the scale factor is given by $$\lambda = \frac{1+\gamma}{4\gamma} = \frac{c_n + 5 + \sqrt{(c_n+1)(c_n+9)}}{16}. \quad (18)$$

Figure 5:
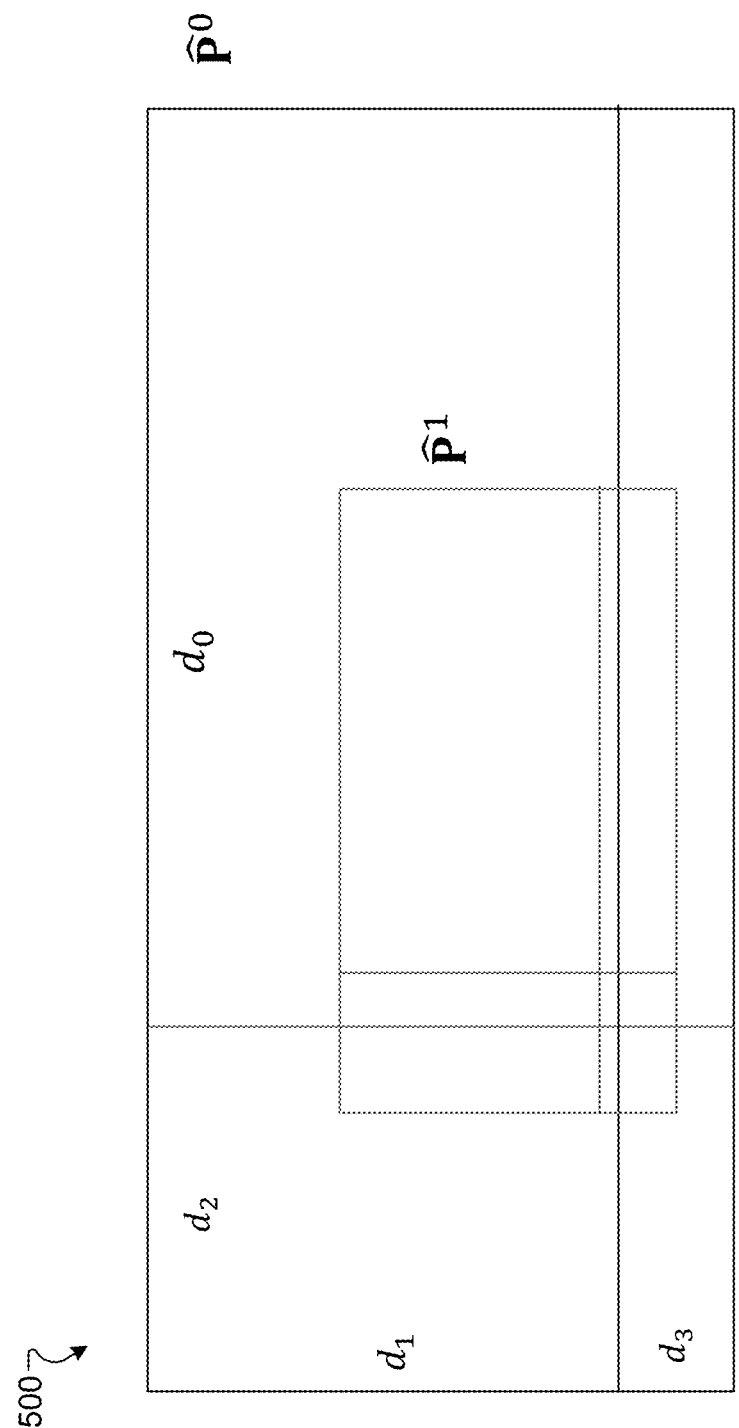
FIG. 5 is a diagram illustrating an example eigen polyhedron used to determine refinement rules for a NURBS surface.

An eigen polyhedron 500 for the NURBS surface is shown in FIG. 5. The NURBS surface has spokes aligned with horizontal and vertical axes and have different lengths resulting from different knot intervals. In this case, the valence number is four, and in some implementations, the eigen polyhedron may be defined as follows:

$$\hat{V}^0 = (0, 0), \quad (19)$$

$$\hat{E}_i^0 = \frac{2d_i + d_{i+2}}{3}\left(\cos\left(\frac{\pi i}{2}\right), \sin\left(\frac{\pi i}{2}\right)\right), \quad (20)$$

$$\hat{F}_i^0 = \hat{E}_i^0 + \hat{E}_{i+1}^0. \quad (21)$$

Because n=4, λ=½. Further, the translation may be deduced by substituting Eqs. (19)-(21) into Eq. (8):

$$T^0 = \frac{1}{6}(d_0 - d_2, d_1 - d_3). \quad (22)$$

Figure 6:
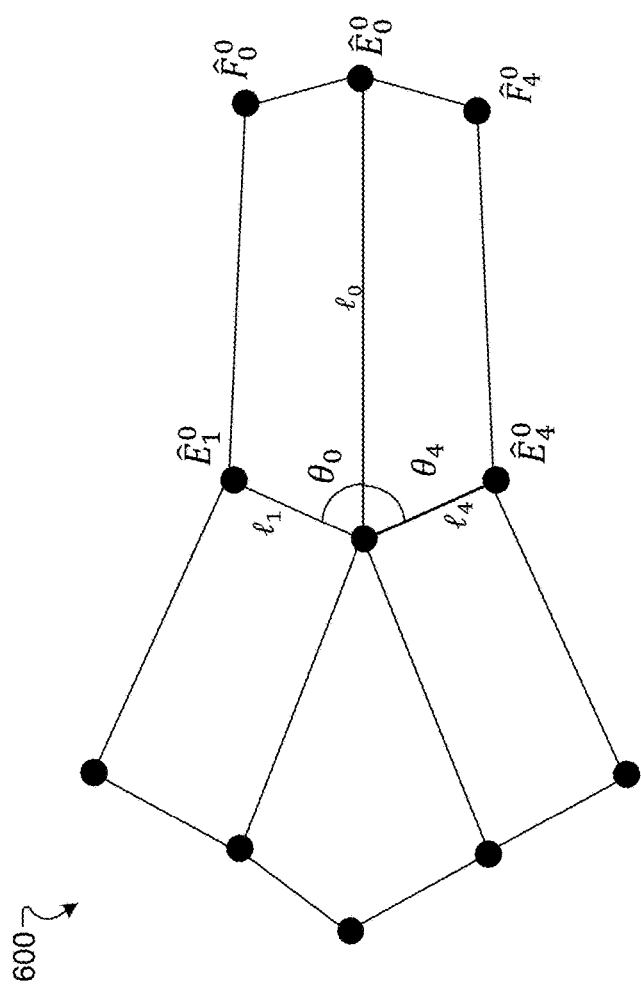
FIG. 6 is a diagram illustrating an example eigen polyhedron having different knot intervals corresponding to different spoke edges.

A more general case in which an eigen polyhedron having both a vertex having a valence number not equal to four and unequal knot intervals is illustrated in FIG. 6. The following prescription is not unique but does reduce to the Catmull-Clark eigen polyhedron in Eqs. (14)-(18) when the knot intervals are all the same or the NURBS eigen polyhedron when the valence number is four.

As shown in FIG. 6, the eigen polyhedron 600 has a vertex $\hat{V}^0$ at the origin and a valence number of five. The spoke $\hat{V}^0\hat{E}_0^0$ is aligned with the horizontal axis and has length $\ell_0$. The spoke $\hat{V}^0\hat{E}_i^0$ has length $\ell_i$ and has a spoke angle $\angle \hat{E}_i^0\hat{V}^0\hat{E}_0^0=\theta_i$. To define the eigen polyhedron 600, it is assumed that the spoke angles are all equal. Accordingly, $$\theta_i = \frac{2\pi}{n}, \forall i = 0, 1, \ldots, n-1. \quad (23)$$

The spoke lengths $\ell_i$ are defined as being equal to $$l_i = \frac{1}{3}(d_i + d_i^- + d_i^+), \text{ where} \quad (24)$$

$$d_i^+ = \sum_{j=i}^{i+n+1} d_j \cos\theta_{i,j} H(\theta_{i,j}), \quad (25)$$

$$d_i^- = -\sum_{j=i}^{i+n+1} d_j \cos\theta_{i,j}, H(-\theta_{i,j}) \quad (26)$$

where H(x)=1 when x>0 and 0 when x<0, and where $$\theta_{i,j} = \sum_{k=i}^{j-1} \theta_k = \frac{(j-i)2\pi}{n}. \quad (27)$$

The edge points may then be defined as located at the coordinates $$\ddot{E}_i^0 = \ell_i(\cos\theta_{0,i}, \sin\theta_{0,i}). \quad (28)$$

The face points may be generated using Eq. (16).

Returning to FIG. 1, the refinement matrix manager 150 is configured to generate refinement matrix data 152 based on the eigen polyhedron data 142 such as that specified in Eqs. (14)-(18) for a Catmull-Clark surface or Eqs. (19)-(22) for a NURBS surface. The refinement matrix data 152 represents the refinement matrix M as constructed from the eigen polyhedron data 142.

As stated above, the refinement matrix M is not uniquely determined from the eigen polyhedron data 142. The refinement matrix M satisfies additional properties in order for it to be generated by the refinement matrix manager 150. One possible way to determine M is to note that (1) because the sum of the rows of M equal one, the largest eigenvalue of M is equal to one and (2) the second and third eigenvalues are equal and are both equal to the scale factor (e.g., in Eq. (18)). When the condition (2) is satisfied, then the limit surface is $G^1$ at an extraordinary point.

It is further preferable that the refinement matrix M satisfy Eq. (10), i.e., that the eigen polyhedron is in fact an eigenfunction corresponding to one of the equal eigenvalues. Moreover, if the knot intervals are all equal, the refinement matrix M should reproduce the refinement rules in Eqs. (3)-(5). Also, if the valence number is four, the refinement matrix M should reproduce the refinement rules in Eqs. (6)-(9). A generation of the refinement matrix M from the eigen polyhedron in Eqs. (23)-(28) is detailed in the discussion to follow with respect to FIGS. 7A-7C.

Figure 7A:
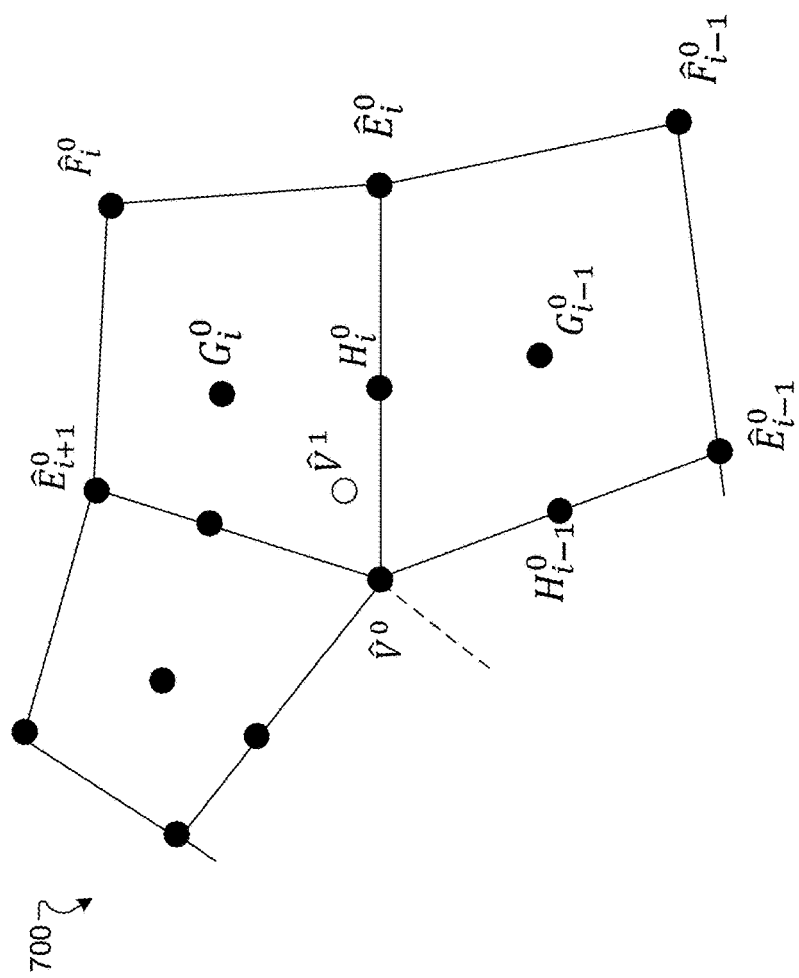
FIG. 7A is a diagram illustrating an example refinement operation with respect to a vertex of an eigen polyhedron.

FIG. 7A is a diagram illustrating an example vertex generation using an eigen polyhedron 700. The eigen polyhedron 700 shown in FIG. 7A has an initial vertex $\hat{V}^0$, initial edge points $\hat{E}_i^0$, initial face points $\hat{F}_i^0$, and a vertex after refinement, i.e., the translation $\hat{V}^1$. As in FIG. 6, the valence number of the vertex is n and the knot intervals are different. The eigenvalue, or scale factor, $\lambda$ is as defined in Eq. (18). An example vertex generation is stated as follows:

$$n \sum_{i=1}^{n} (m_i + f_i)\hat{V}^1 = 3 \sum_{i=1}^{n} (m_i H_i^0 + f_i G_i^0), \text{ where} \quad (29)$$

$$H_i^0 = q_i \hat{E}_i^0 + (1 - q_i) V^0, \quad (30)$$

$$G_i^0 = \quad (31)$$
$$q_i(1 - q_{i+1})\hat{E}_i^0 + q_{i+1}(1 - q_i)\hat{E}_{i+1}^0 + q_i q_{i+1}\hat{F}_i^0 + (1 - q_i)(1 - q_{i+1})\hat{F}_{i+1}^0,$$

$$q_i = \frac{d_{i-2} + d_{i+2} + d_i}{d_{i-2} + d_{i+2} + 4d_i}, \quad (32)$$

$$f_i = \prod_{j=1, j \ne i, i+1}^{n} d_j^+, \quad (33)$$

$$m_i = f_i + f_{i-1}. \quad (34)$$

The translation is then given by Eq. (29).

Figure 7B:
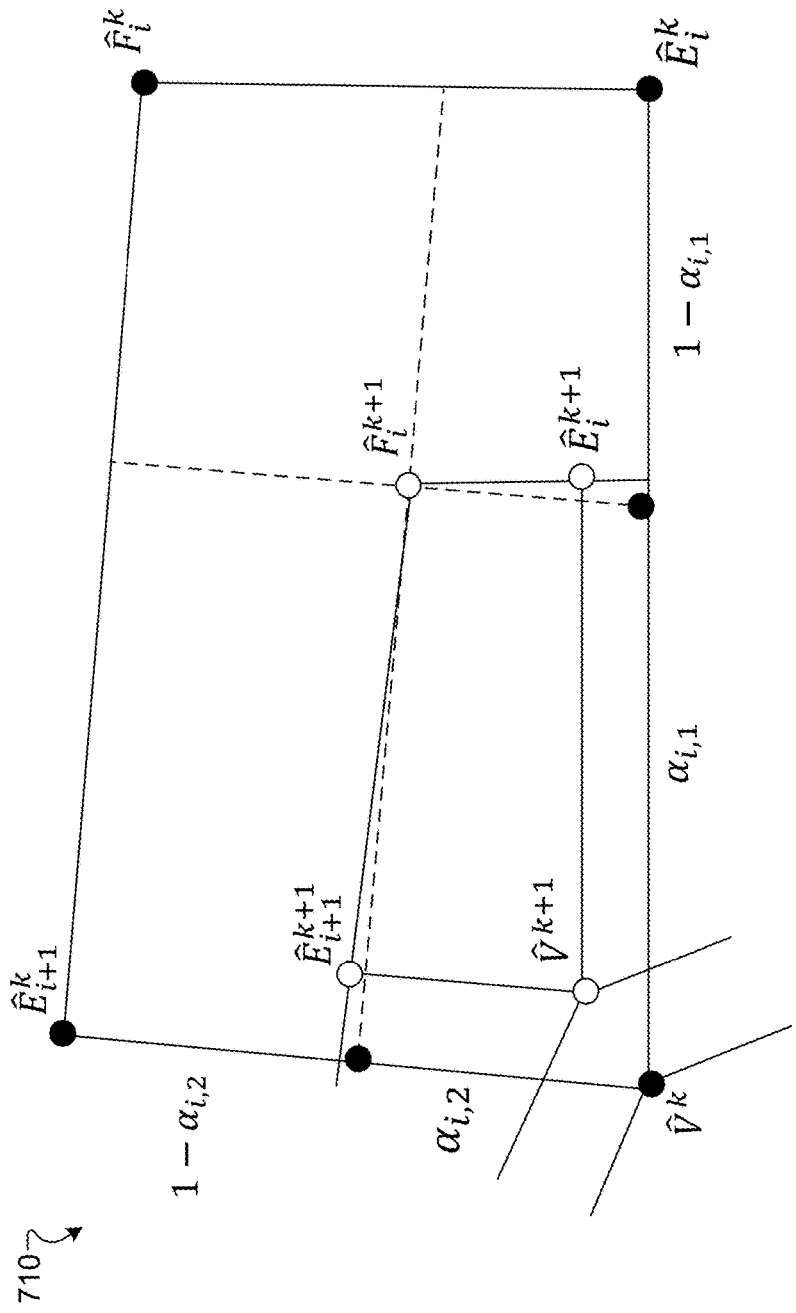
FIG. 7B is a diagram illustrating an example refinement operation with respect to a face point of an eigen polyhedron.

FIG. 7B is a diagram illustrating an example refinement operation with respect to a face point of an eigen polyhedron. In principle, the face point $\hat{F}_i^1$ of the refined plane mesh may be computed using Eq. (10) as $\hat{F}_i^1 = \hat{V}^1 + \lambda \hat{F}_i^0$. Nevertheless, for the purposes of generating the refinement matrix M, an equation for the face point $\hat{F}_i^1$ may be produced in terms of the four initial vertices surrounding that face point. That equation is as follows:

$$\hat{F}_i^1 = (1-\alpha_{i,1})(1-\alpha_{i,2})\hat{V}^0 + \alpha_{i,1}(1-\alpha_{i,2})\hat{E}_i^0 + (1-\alpha_{i,1})\alpha_{i,2}\hat{E}_{i+1}^0 + \alpha_{i,1}\alpha_{i,2}\hat{F}_i^0. \quad (35)$$

Eq. (35) represents a pair of bilinear equations for the coordinates of the refined face point in terms of unknown parameters $\alpha_{i,1}$ and $\alpha_{i,2}$. In some implementations, these parameters may be determined as follows: Let $v_1 = \hat{F}_i^1 - \hat{V}^0$, $v_2 = \hat{F}_i^1 - \hat{E}_i^0$, $v_3 = \hat{F}_i^1 - \hat{F}_i^0$, and $v_4 = \hat{F}_i^1 - \hat{E}_{i+1}^0$. Further, let $S_i = \frac{1}{2} v_i v_{i+1}$ and $T_i = \frac{1}{2} v_{i-1} v_{i+1}$. Then $$\alpha_{i,1} = \frac{2S_4}{2S_4 - T_1 + T_2 + \sqrt{D}}, \quad (36)$$

$$\alpha_{i,2} = \frac{2S_1}{2S_1 - T_1 + T_2 + \sqrt{D}}, \text{ where} \quad (37)$$

$$D = T_1^2 + T_2^2 + 2S_1 S_3 + 2S_2 S_4. \quad (38)$$

In some implementations, the refinement matrix manager 150 uses a numerical root-finder to generate the values of $\alpha_{i,1}$ and $\alpha_{i,2}$ and thus the entries of the refinement matrix M corresponding to a face point refinement rule.

Figure 7C:
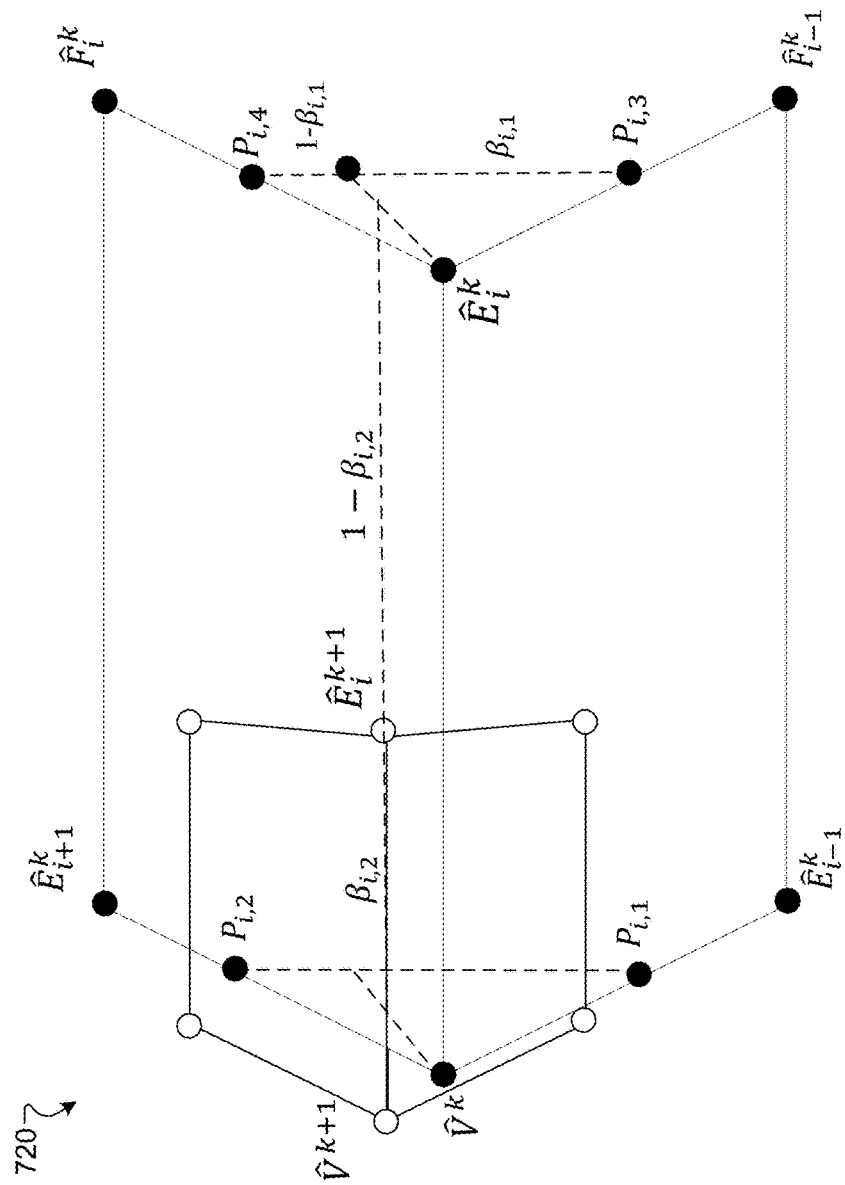
FIG. 7C is a diagram illustrating an example refinement operation with respect to an edge point of an eigen polyhedron.

FIG. 7C is a diagram illustrating an example refinement operation with respect to an edge point of an eigen polyhedron. In principle, the edge point $\hat{E}_i^1$ of the refined plane mesh may be computed using Eq. (10) as $\hat{E}_i^1 = \hat{V}^1 + \lambda \hat{E}_i^0$. Nevertheless, for the purposes of generating the refinement matrix M, an equation for the edge point $\hat{E}_i^1$ may be produced in terms of the six initial vertices of the two faces corresponding to the edge as shown in FIG. 7C. That equation is as follows. First denote $$P_{i,1} = (1-\alpha_{i-1,1})\hat{V}^0 + \alpha_{i-1,1}\hat{E}_{i-1}^0, \quad (39)$$

$$P_{i,2} = (1-\alpha_{i,2})\hat{V}^0 + \alpha_{i,2}\hat{E}_i^0, \quad (40)$$

$$P_{i,3} = (1-\alpha_{i-1,1})\hat{E}_i^0 + \alpha_{i-1,1}\hat{F}_{i-1}^0, \quad (41)$$

$$P_{i,4} = (1-\alpha_{i,2})\hat{E}_i^0 + \alpha_{i,2}\hat{F}_i^0. \quad (42)$$

The edge point is then generated as follows:

$$\hat{E}_i^1 = (1 - \beta_{i,2})\left(\frac{1-\beta_{i,1}}{2}P_{i,1} + \frac{\beta_{i,1}}{2}P_{i,2} + \frac{1}{2}\hat{V}^0\right) + \quad (43)$$
$$\beta_{i,2}\left(\frac{1-\beta_{i,1}}{2}P_{i,3} + \frac{\beta_{i,1}}{2}P_{i,4} + \frac{1}{2}\hat{E}_i^0\right),$$

where $\beta_{i,1}$ and $\beta_{i,2}$ are unknown parameters. In some implementations, the refinement matrix manager 150 uses the same numerical root-finder as that used with respect to the face point generation to determine the parameters $\beta_{i,1}$ and $\beta_{i,2}$, as Eq. (43) is a pair of bilinear equations having the same form as that in Eq. (35).

Returning to FIG. 1, the refinement operation manager 160 is configured to apply the refinement matrix represented by the refinement matrix data 152 to the spatial mesh data 132 to produce refined mesh data 162 representing a refined spatial mesh. The application of refinement rules using the refinement matrix data 152 that was derived using an eigen polyhedron in a plane (i.e., a two-dimensional plane mesh) to a three-dimensional spatial mesh is not trivial. Nevertheless, excellent spatial mesh refinement has resulted in such an application, notably limiting surfaces that are $G^1$ in the neighborhood and at an extraordinary point.

In some implementations, the generation of the refinement matrix M assumes that extraordinary points of a spatial mesh are separated by at least one face. In some implementations, when extraordinary points of a spatial mesh are in adjacent faces, then the refinement matrix manager 150 is configured to perform an initial refinement operation using any formulation of the refinement rules described above.

The components (e.g., modules, processing units 124) of the computer 120 can be configured to operate based on one or more platforms (e.g., one or more similar or different platforms) that can include one or more types of hardware, software, firmware, operating systems, runtime libraries, and/or so forth. In some implementations, the components of the computer 120 can be configured to operate within a cluster of devices (e.g., a server farm). In such an implementation, the functionality and processing of the components of the computer 120 can be distributed to several devices of the cluster of devices.

The components of the computer 120 can be, or can include, any type of hardware and/or software configured to process attributes. In some implementations, one or more portions of the components shown in the components of the computer 120 in FIG. 1 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the computer 120 can be, or can include, a software module configured for execution by at least one processor (not shown). In some implementations, the functionality of the components can be included in different modules and/or different components than those shown in FIG. 1.

In some embodiments, one or more of the components of the computer 120 can be, or can include, processors configured to process instructions stored in a memory. For example, a spatial mesh data acquisition manager 130 (and/or a portion thereof), a eigen polyhedron manager 140 (and/or a portion thereof), a refinement matrix manager 150 (and/or a portion thereof), and a refinement operation manager 160 (and/or a portion thereof can be a combination of a processor and a memory configured to execute instructions related to a process to implement one or more functions.

In some implementations, the memory 126 can be any type of memory such as a random-access memory, a disk drive memory, flash memory, and/or so forth. In some implementations, the memory 126 can be implemented as more than one memory component (e.g., more than one RAM component or disk drive memory) associated with the components of the computer 120. In some implementations, the memory 126 can be a database memory. In some implementations, the memory 126 can be, or can include, a non-local memory. For example, the memory 126 can be, or can include, a memory shared by multiple devices (not shown). In some implementations, the memory 126 can be associated with a server device (not shown) within a network and configured to serve the components of the editing computer 120. As illustrated in FIG. 1, the memory 126 is configured to store various data, including spatial mesh data 132, eigen polyhedron data 142, refinement matrix data 152, and refined mesh data 162.

In some implementations, the network interface 122 includes, for example, Ethernet adaptors, Token Ring adaptors, and the like, for converting electronic and/or optical signals received from a network to electronic form for use by the editing computer 120. The set of processing units 124 include one or more processing chips and/or assemblies. The memory 126 includes both volatile memory (e.g., RAM) and non-volatile memory, such as one or more ROMs, disk drives, solid state drives, and the like.

Figure 8:
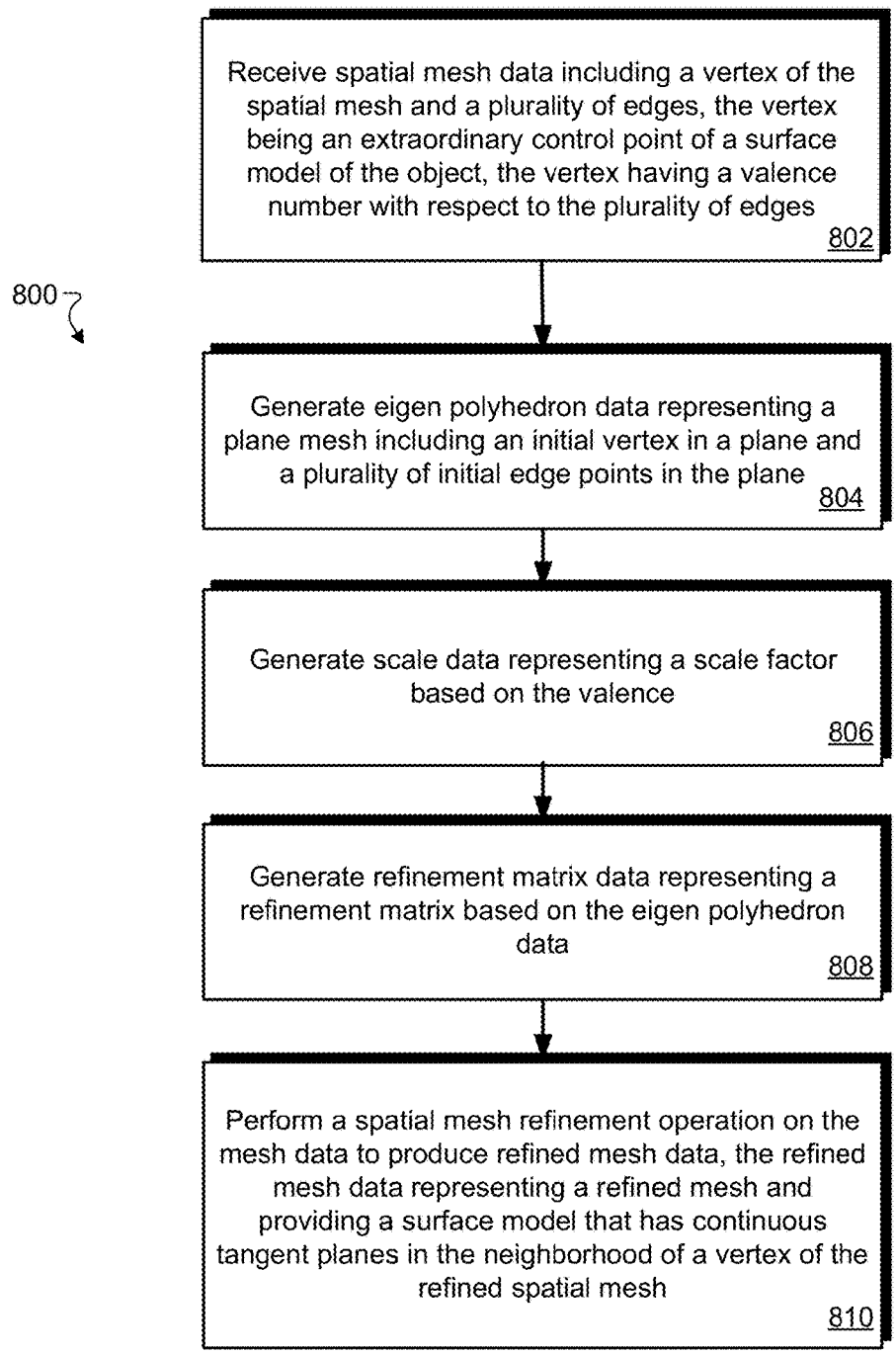
FIG. 8 is a flow chart that illustrates an example method of implementing the improved techniques as shown in the electronic environment in FIG. 1.

FIG. 8 is a flow chart depicting an example method 800 of displaying user-specified drawings on a display device. The method 800 may be performed by software constructs described in connection with FIG. 1, which reside in memory 126 of the computer 120 and are run by the set of processing units 124.

At 802, the spatial mesh data acquisition manager 130 receives spatial mesh data 132 representing a spatial mesh. The spatial mesh data 132 includes vertex data 135 representing a vertex of the spatial mesh and a plurality of edges. In some implementations, the spatial mesh data 132 also includes a plurality of faces. The vertex is an extraordinary control point of a surface model of the object. Upon refinement, the spatial mesh data 132 includes edge point data 133 representing a plurality of edge points. Each of the plurality of edge points are disposed on an edge between the vertex and a respective, adjacent control point of the surface model. The spatial mesh data further includes valence data 136 representing a valence number of the vertex with respect to the plurality of edge points.

At 804, the eigen polyhedron manager 140 generates eigen polyhedron data 142 representing a plane mesh. The eigen polyhedron data 142 includes vertex data 145 representing an initial vertex in a plane and edge point data 143 representing a plurality of initial edge points in the plane. The plurality of initial edge points are arranged in the plane with respect to the initial vertex based on the valence number.

At 806, the eigen polyhedron manager 140 generates scale data 146 representing a scale factor based on the valence number. The plane mesh (i.e., the eigen polyhedron) is configured to scale in size with respect to the initial vertex in the plane by the scale factor after a plane mesh refinement operation.

At 808, the refinement matrix manager 150 generates refinement matrix data 152 representing a refinement matrix based on the eigen polyhedron data. The eigen polyhedron data are eigenvectors of the refinement matrix data. The scale factor is an eigenvalue of the refinement matrix corresponding to at least one of the eigenvectors.

At 810, the refinement operation manager 160 performs a spatial mesh refinement operation on the spatial mesh data 132 to produce refined mesh data 162. The spatial mesh refinement operation is based on the refinement matrix data 152. The refined mesh data 162 represents a refined mesh and provides a surface model that has continuous tangent planes in the neighborhood of a vertex of the refined spatial mesh. The refined mesh data 162 provides an accurate surface model of the object for manufacture when the surface model has an extraordinary control point.

Figure 9A:
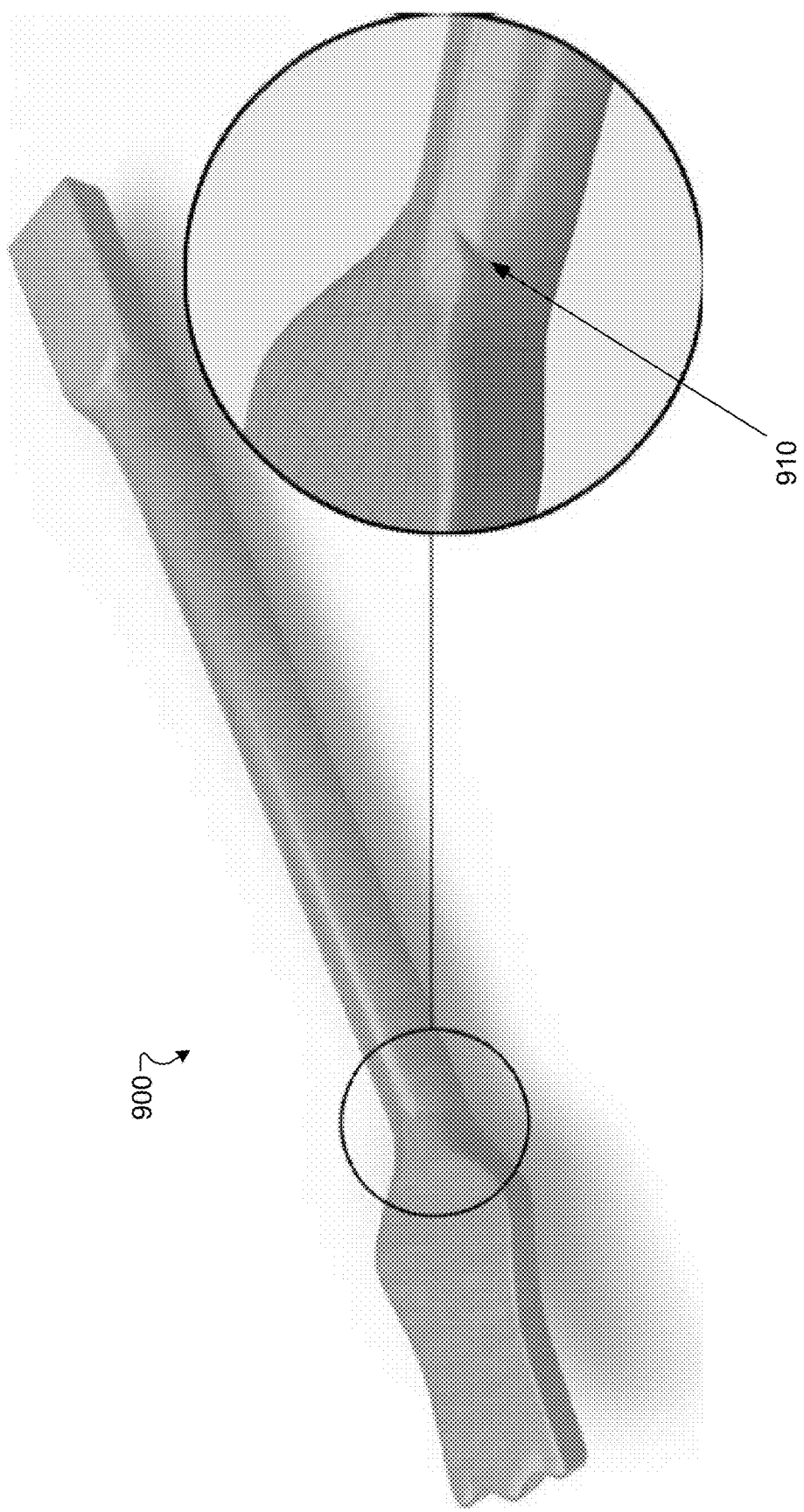
FIG. 9A is a diagram illustrating an example manufacturable object that is not $G^1$ at an extraordinary control point.

FIG. 9A is a diagram illustrating an example surface model 900 of a guitar neck that was generated according to the conventional approaches to refining a model of a complex surface. As has been discussed above, the conventional approaches result in a surface tangent discontinuity at an extraordinary point 910 of the limiting surface of the guitar neck 900. Such a discontinuity of the surface tangent at the point 910 may lead to inaccuracies in an actual guitar neck manufactured according to the surface model 900.

FIG. 9B is diagram illustrating an example surface model 920 of the guitar neck that was generated according to the improved techniques described herein. In contrast to the surface model 900 that has a surface tangent discontinuity that may result in inaccurate artifacts in a guitar neck manufactured according to the surface model 900, the surface model 920 is $G^1$ at the extraordinary point 930 (i.e., the surface tangent at the point 930 is continuous). Accordingly, a guitar neck manufactured according to the surface model 920 has a smooth surface at the extraordinary point 930 and thus lacks artifacts such a cusps and bumps that are a result of a lack of surface tangent continuities.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method, comprising:
receiving, by processing circuitry configured to generate a surface model representing an object for manufacture, spatial mesh data representing a spatial mesh, the spatial mesh including a vertex of the spatial mesh and a plurality of edges, the vertex being an extraordinary control point of the spatial mesh, each of the plurality of edges being disposed between the vertex and a respective, adjacent control point of the spatial mesh, the vertex having a valence number with respect to the plurality of edges;
generating, by the processing circuitry, eigen polyhedron data representing a plane mesh including an initial vertex in a plane and a plurality of initial edge points in the plane, the plurality of initial edge points being arranged in the plane with respect to the initial vertex based on the valence number;
generating, by the processing circuitry, scale data representing a scale factor based on the valence number, the plane mesh being configured to scale in size with respect to the initial vertex in the plane by the scale factor after a plane mesh refinement operation;
generating, by the processing circuitry, refinement matrix data representing a refinement matrix based on the eigen polyhedron data, the eigen polyhedron data being eigenvectors of the refinement matrix data, the scale factor being an eigenvalue of the refinement matrix corresponding to at least one of the eigenvectors; and
performing, by the processing circuitry, a spatial mesh refinement operation on the spatial mesh data to produce refined mesh data, the spatial mesh refinement operation being based on the refinement matrix data, the refined mesh data representing a refined mesh and providing a surface model that has continuous tangent planes in a neighborhood of a vertex of the refined spatial mesh, thereby providing an accurate surface model of the object for manufacture when the surface model has an extraordinary control point.

2. The method of claim 1, wherein the refinement matrix data includes translation vector data representing a translation vector by which the plane mesh is translated after the plane mesh refinement operation.

3. The method of claim 2, wherein the translation vector is equal to a vertex of the refined plane mesh.

4. The method of claim 1, wherein the refinement matrix has at least three eigenvalues arranged in decreasing order of magnitude, second and third eigenvalues of the refinement matrix each being equal to the scale factor.

5. The method of claim 1, wherein the spatial mesh further includes a plurality of faces, each of the plurality of faces including edges connecting control points of the spatial mesh adjacent to the vertex of the spatial mesh; and
wherein the plane mesh further includes a plurality of initial face points, each of the initial face points being disposed between a respective initial edge point of the plurality of initial edge points.

6. The method of claim 5, wherein generating the refinement matrix data includes:
generating coefficients of a bilinear equation for a vertex of the refined plane mesh, the bilinear equation having terms including the vertex of the plane mesh, the plurality of edge points of the plane mesh and the plurality of face points of the plane mesh.

7. The method of claim 5, wherein generating the refinement matrix data includes:
generating coefficients of a bilinear equation for a face point of a plurality of face points of the refined plane mesh, the bilinear equation having terms including a corresponding initial face point of the plurality of initial face points of the plane mesh, adjacent initial edge points of the plurality of initial edge points of the plane mesh, and the initial vertex of the plane mesh.

8. The method of claim 5, wherein generating the refinement matrix data includes:
generating coefficients of a bilinear equation for an edge point of a plurality of edge points of the refined plane mesh, the bilinear equation having terms including a corresponding initial edge point and adjacent edge points of the plurality of initial edge points of the plane mesh, a corresponding initial face point and an adjacent initial edge points of the plurality of initial edge points of the plane mesh, and the initial vertex of the plane mesh.

9. The method of claim 1, wherein each of the plurality of edges has a respective knot interval of a plurality of knot intervals from the vertex, at least one of the knot intervals of the plurality of knot intervals being different from another knot intervals of the plurality of knot intervals.

10. The method of claim 9, wherein, in response to the valence number being equal to 4, generating the scale data includes setting the scale factor equal to ½.

11. The method of claim 9, wherein, in response to the valence number being equal to 4 and the plurality of initial edge points of the plane mesh being disposed on one of a horizontal axis and a vertical axis through the initial vertex of the plane mesh, the refinement matrix produces refinement rules for a non-uniform rational B-spline (NURBS) surface model.

12. The method of claim 1, wherein each of the plurality of edges has a length equal to a respective knot interval of a plurality of knot intervals from the vertex, each of the plurality of knot intervals being equal to other knot intervals of the plurality of knot intervals.

13. The method of claim 12, wherein the refinement matrix produces refinement rules for a Catmull-Clark surface model.

14. The method of claim 1, wherein the plurality of initial edge points of the plane mesh are disposed symmetrically about the initial vertex of the plane mesh.

15. A computer program product comprising a nontransitory storage medium, the computer program product including code that, when executed by processing circuitry of a computer configured to generate a surface model representing an object for manufacture, causes the processing circuitry to perform a method, the method comprising:

receiving spatial mesh data representing a spatial mesh, the spatial mesh including a vertex of the spatial mesh and a plurality of edges, the vertex being an extraordinary control point of the spatial mesh, each of the plurality of edges being disposed between the vertex and a respective, adjacent control point of the spatial mesh, the vertex having a valence number with respect to the plurality of edges;

generating eigen polyhedron data representing a plane mesh including an initial vertex in a plane and a plurality of initial edge points in the plane, the plurality of initial edge points being arranged in the plane with respect to the initial vertex based on the valence number;

generating scale data representing a scale factor based on the valence number, the plane mesh being configured to scale in size with respect to the initial vertex in the plane by the scale factor after a plane mesh refinement operation;

generating refinement matrix data representing a refinement matrix based on the eigen polyhedron data, the eigen polyhedron data being eigenvectors of the refinement matrix data, the scale factor being an eigenvalue of the refinement matrix corresponding to at least one of the eigenvectors; and performing a spatial mesh refinement operation on the spatial mesh data to produce refined mesh data, the spatial mesh refinement operation being based on the refinement matrix data, the refined mesh data representing a refined mesh and providing a surface model that has continuous tangent planes in a neighborhood of a vertex of the refined spatial mesh, thereby providing an accurate surface model of the object for manufacture when the surface model has an extraordinary control point.

16. The computer program product of claim 15, wherein the refinement matrix data includes translation vector data representing a translation vector by which the plane mesh is translated after the plane mesh refinement operation.

17. The computer program product of claim 15, wherein the refinement matrix has at least three eigenvalues arranged in decreasing order of magnitude, second and third eigenvalues of the refinement matrix each being equal to the scale factor.

18. The computer program product of claim 15, wherein the spatial mesh further includes a plurality of faces, each of the plurality of faces including edges connecting control points of the spatial mesh adjacent to the vertex of the spatial mesh; and wherein the plane mesh further includes a plurality of initial face points, each of the initial face points being disposed between a respective initial edge point of the plurality of initial edge points.

19. The computer program product of claim 15, wherein each of the plurality of edges has a respective knot interval of a plurality of knot intervals from the vertex, at least one of the knot intervals of the plurality of knot intervals being different from another knot intervals of the plurality of knot intervals.

20. An electronic apparatus configured to generate a surface model representing an object for manufacture, the electronic apparatus comprising:

a network interface;
a memory; and
controlling circuitry coupled to the memory, the controlling circuitry being configured to:

receive spatial mesh data representing a spatial mesh, the spatial mesh including a vertex of the spatial mesh and a plurality of edges, the vertex being an extraordinary control point of the spatial mesh, each of the plurality of edges being disposed between the vertex and a respective, adjacent control point of the spatial mesh, the vertex having a valence number with respect to the plurality of edges;

generate eigen polyhedron data representing a plane mesh including an initial vertex in a plane and a plurality of initial edge points in the plane, the plurality of initial edge points being arranged in the plane with respect to the initial vertex based on the valence number;

generate scale data representing a scale factor based on the valence number, the plane mesh being configured to scale in size with respect to the initial vertex in the plane by the scale factor after a plane mesh refinement operation;

generate refinement matrix data representing a refinement matrix based on the eigen polyhedron data, the eigen polyhedron data being eigenvectors of the refinement matrix data, the scale factor being an eigenvalue of the refinement matrix corresponding to at least one of the eigenvectors; and perform a spatial mesh refinement operation on the spatial mesh data to produce refined mesh data, the spatial mesh refinement operation being based on the refinement matrix data, the refined mesh data representing a refined mesh and providing a surface model that has continuous tangent planes in a neighborhood of a vertex of the refined spatial mesh, thereby providing an accurate surface model of the object for manufacture when the surface model has an extraordinary control point.

* * * * *